(12) United States Patent
Myer

(10) Patent No.: US 6,310,788 B1
(45) Date of Patent: Oct. 30, 2001

(54) THREE-WAY, THREE PHASE POWER DIVIDER AND COMBINER

(76) Inventor: Daniel Myer, 780 Rutgers Rd., Franklin Square, NY (US) 11010

( * ) Notice: Subject to any disclaimer, the term of this patent is extended or adjusted under 35 U.S.C. 154(b) by 58 days.

(21) Appl. No.: 09/587,989

(22) Filed: Jun. 6, 2000

(51) Int. Cl.$^7$ .................................................. H02M 1/12
(52) U.S. Cl. ............................................. 363/39; 323/213
(58) Field of Search .................................... 323/212, 213, 323/215; 363/1, 2, 3, 4, 5, 39, 148, 149

(56) References Cited

U.S. PATENT DOCUMENTS 4,665,322 * 5/1987 Eishima et al. ..................... 363/2 X 6,088,245 * 7/2000 Ainsworth .......................... 363/39

* cited by examiner

Primary Examiner—Jessica Han
(74) Attorney, Agent, or Firm—Collard & Roe, PC

(57) ABSTRACT

The invention relates to a three-way, three-phase power divider or combiner. More specifically, the invention will split or combine power into three different phases at 0 degrees, 60 degrees and 120 degrees using lumped elements, waveguides, microstripline, stripline and coaxial cable. The shift in phase of each leg of the power divider or combiner results in suppression of harmonic distortion, improved efficiency and matching of identical amplifiers with equivalent input impedances or reflection coefficients.

10 Claims, 5 Drawing Sheets

Phase Lattice #'s 1, 2 and 3:
All pass phase bridges designed for phase shifts of theta ± 0, , ± 60 and ± 120 degrees, respectively.

Phase Lattice #'s 1, 2 and 3:
All pass phase bridges designed for phase shifts of
theta ± 0, , ± 60 and ± 120 degrees, respectively.

L1 = Length of waveguide cut to an electrical length of theta ± 0 degrees
L2 = Length of waveguide cut to an electrical length of theta ± 60 degrees
L3 = Length of waveguide cut to an electrical length of theta ± 120 degrees

THREE-WAY, THREE PHASE POWER DIVIDER AND COMBINER

BACKGROUND OF THE INVENTION

Field of the Invention

The invention relates to a three-way, three-phase power divider or combiner. More specifically, the invention will split power into three equally powered signals with different phases of 0 degrees, 60 degrees and 120 degrees. The phases can also be 0 degrees,–60 degrees and–120 degrees. The invention will also combine three signals of equal power that are sixty degrees relative in phase into one signal.

SUMMARY OF THE INVENTION

RF Power Dividers or Combiners make possible the generation of high levels of RF power using lower powered RF transistors. This facilitates the substitution of transistors in place of high-powered tubes, yielding more reliable designs.

By splitting the power into the three phases of 0, 60 and 120 degrees, rather than all three signals being in phase, a good front end VSWR match is produced, the third and fifth harmonic is suppressed, and a flat power gain response is produced over a broad bandwidth.

The power divider feeds into three individual power amplifiers, which increase the power to upwards of hundreds or thousands of watts. By splitting the signal into those three phases, three amplifiers when recombined with a 3-phase combiner can then be used to suppress the third and fifth harmonics. There is also good VSWR at the front end, and at the output, across a broad band of frequencies.

An object of the present invention is to provide a matched input port, independent of output port terminations. If all 3 of the divider output ports are terminated with identical loads of identical reflection coefficients (ρ), the input port will look like a perfect match. The output ports can either be 3 open-circuits, 3 short circuits, 3 pure imaginary loads, 3 pure real loads, or 3 complex loads. As long as they are identical in nature and on each of the output ports, then the input port will look like perfect match. If, for example, the divider was designed for a 50 Ohm system, then the input to the divider will look like 50 ohms, regardless of how the 3 output ports are terminated, as long as they are3 identical loads.

Another object of the present invention is to provide constant or improved efficiency into loads with adverse VSWRs. When an amplifier is driven into load VSWRs other that 50 ohms, its efficiency is reduced. A Zero-degree Combiner will not improve the efficiency. However, with a 3-Phase (60 degree)network, the efficiency may remain constant as the amplifiers will alternatively improve or degrade in efficiency, with the net result being constant.

A further object of the present invention is to suppress $3^{rd}$ and $5^{th}$ order harmonics. The phase relationships of the 3-Phase Combiner network helps suppress the $3^{rd}$ and $5^{th}$ order harmonics produced by the amplifiers that are being combined, yielding a better spectral response. A Zero-degree network will provide no suppression of harmonics.

Another object of the present invention is the reduction of reverse Inter-Modulation Distortion(IMD) products. When amplifiers are adjacently located, their output signals sometimes leak into each others output circuitry. If the signals are of slightly different frequencies, they will generate IMD products. The 3-Phase Combiner will suppress these products, while the zero-degree network offers no correction.

BRIEF DESCRIPTION OF THE DRAWINGS

Other objects and features of the present invention will become apparent from the following detailed description considered in connection with the accompanying drawings. It is to be understood, however, that the drawings are designed as an illustration only and not as a definition of the limits of the invention.

In the drawings, wherein similar reference characters denote similar elements throughout the several views.

DETAILED DESCRIPTION OF THE PREFERRED EMBODIMENT

Figure 1A:
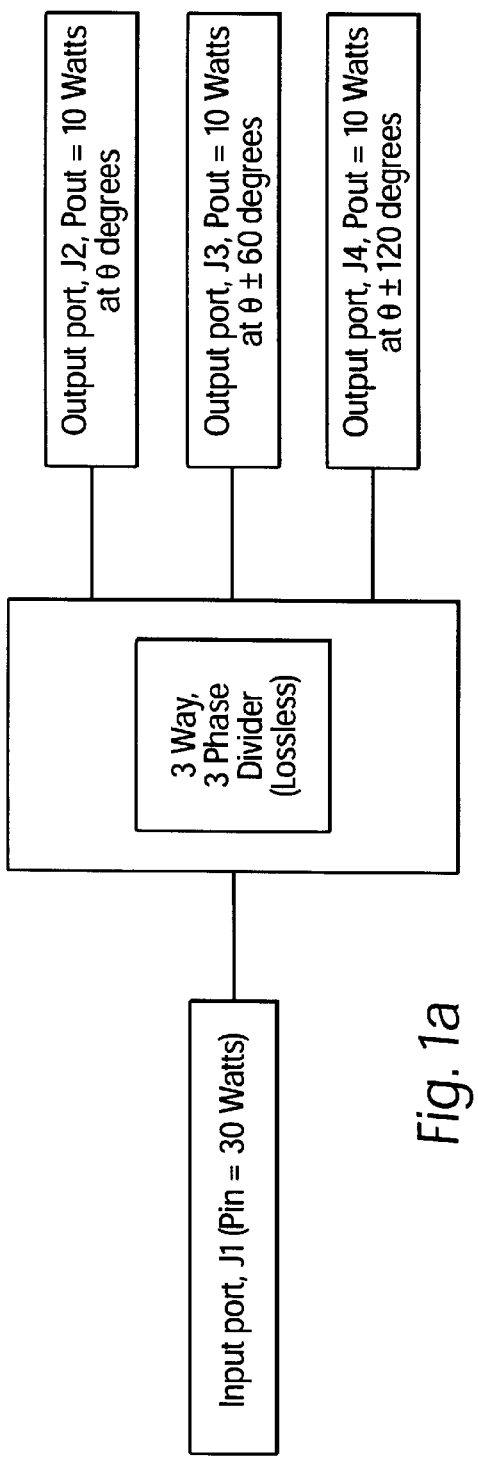
FIG. 1a shows the three-way, three-phase power divider according to the invention.

Referring now in detail to the drawings and, in particular FIG. 1a there is shown a three-way, three-phase power divider that takes any electrical signal at its input and divides the signal's power algebraically into3 equal parts, and sends the power to each of its 3 output ports, while simultaneously shifting the phase of each of the output signals, an absolute value of sixty 60 degrees with respect to the center output port.

For example, if a signal with a power level of 30 watts is applied to the input, the divider will split this signal into 3 output signals of 10 watts each, with ports 2 and 4 each having a relative phase of an absolute value of 60 degrees with respect to port 3. This network can be a narrow-band or broad-band, and operate at frequencies from a few Hertz, up to the multi-giga-Hertz range. The bandwidth and operating frequency range of the network depends on the architecture and methods of circuit construction used. It can be constructed from discrete lumped circuit elements such as resistors, inductors, capacitors and transformers. It may also be designed with distributed circuit elements such as stripline, microstripline, coaxial cable transformers and waveguides. The network will accept any type of signal such as a single sinusoidal wave (CW, Continuous Wave), a composite of many sinusoidal waves of any number (from n=1 to infinity) where "n" is the number of sinusoidal waves of similar or different frequencies. The signal may be simple or complex, pulsed or continuous.

Figure 1B:
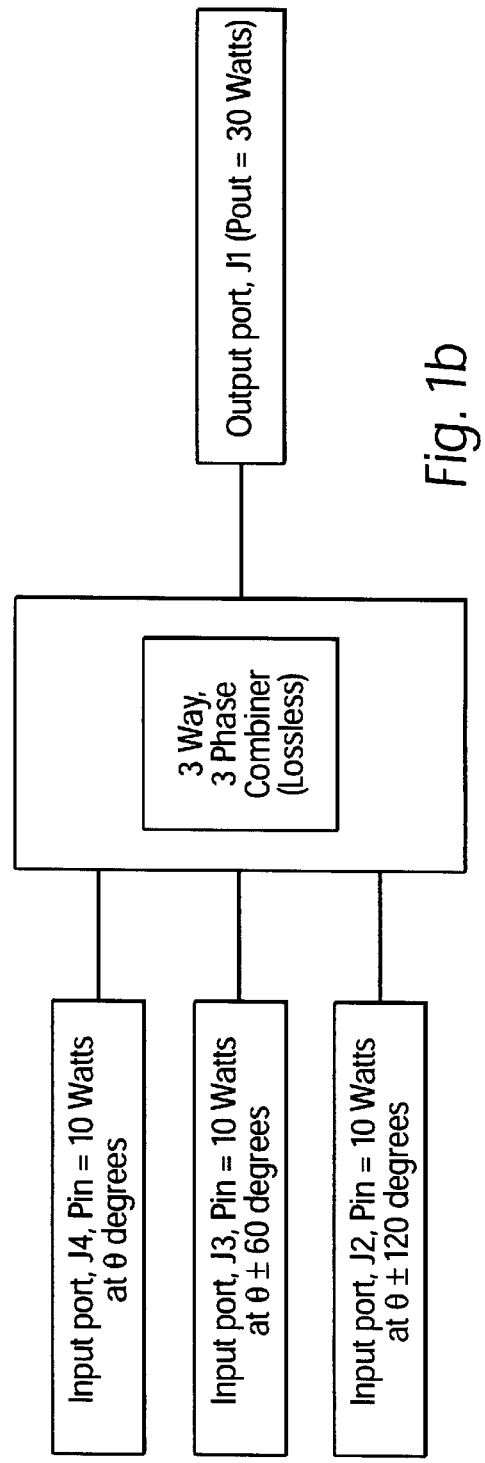
FIG. 1b shows the three-way, three-phase power combiner.

In FIG. 1b the three-way, three-phase power combiner is shown. The Combiner is exactly identical to the three-way, three-phase divider in all respects except that it is used in a reciprocal (reverse) manner. For example, a three-way, three-phase combiner takes 3 signals that are equal in power and are an absolute value of sixty (60) degrees out of phase with the center input port, and combines them into one signal that is the algebraic sum of the three inputs. If each input signal had a power level of 10 watts, then the output power would be a total of 30 watts.

The examples assume ideal conditions where there are no circuit losses in either the divider or combiner network. While the examples show signals of equal power levels, the combiner can accept input signals of unequal power levels, but, it may operate less efficiently.

Figure 2:
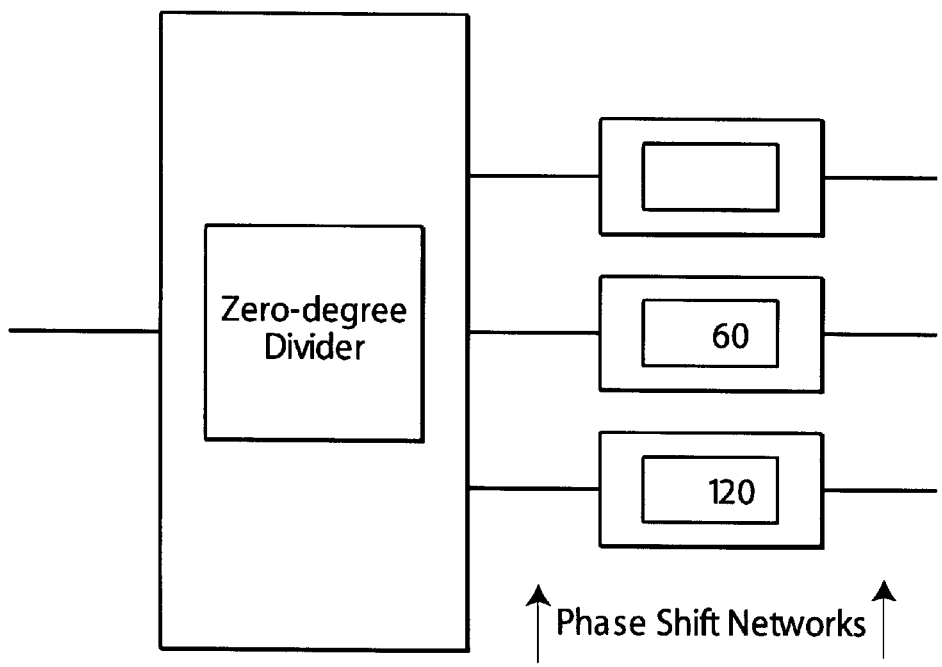
FIG. 2 shows the phase shift network of the three-way, three-phase power divider, and alternatively, shows the phase shift network of the three-way, three-phase power combiner.

FIG. 2a shows the network in further detail. The three-way, three-phase divider consists of three-way, in-phase, also known as a zero-degree, divider with phase-shift networks in each of the 3 output ports.

FIG. 2b shows the combiner with the elements of FIG. 2a except that the phase shift networks are on each of the 3 input ports.

Figure 3:
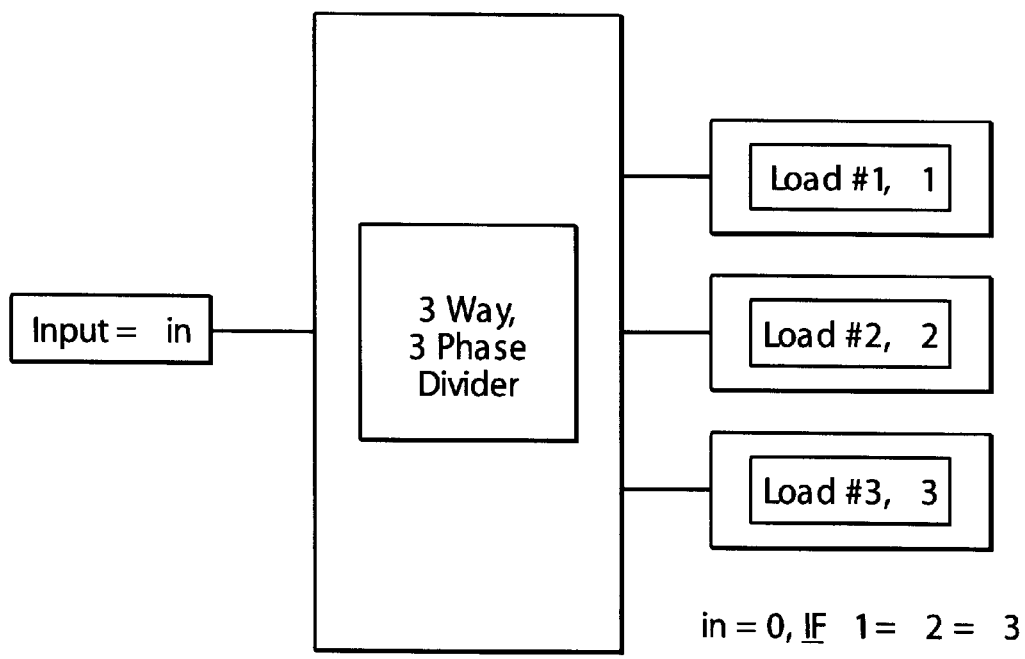
FIG. 3 shows a system with three identical loads.

FIG. 3 shows a network with a matched input port independent of the output port terminations. If all 3 of the dividers output ports are terminated with identical loads of identical reflection coefficients ($\rho$), the input port will appear as a perfect match. The output ports can either be 3 open-circuits, 3 short circuits, 3 pure imaginary loads, 3 pure real loads or 3 complex loads. As long as they are identical in nature and on each of the output ports, then the input port will appear as a perfect match. If, for example, the divider was designed for a 50 Ohm system, then the input to the divider will look like 50 ohms regardless of how the 3 output ports are terminated, as long as they are 3 identical loads.

The phase shifter networks can be accomplished in many ways including, but not limited to: All-Pass, LC Phase Lattice networks, Coaxial cable cut to $\theta+/-0°$, $0+/-60°$ and $\theta+/-120°$, or waveguide cut to $\theta+/-0°$, $0+/-60°$ and $\theta+/-120°$ (where $\theta$ is a relative phase length present in each network).

Figure 4:
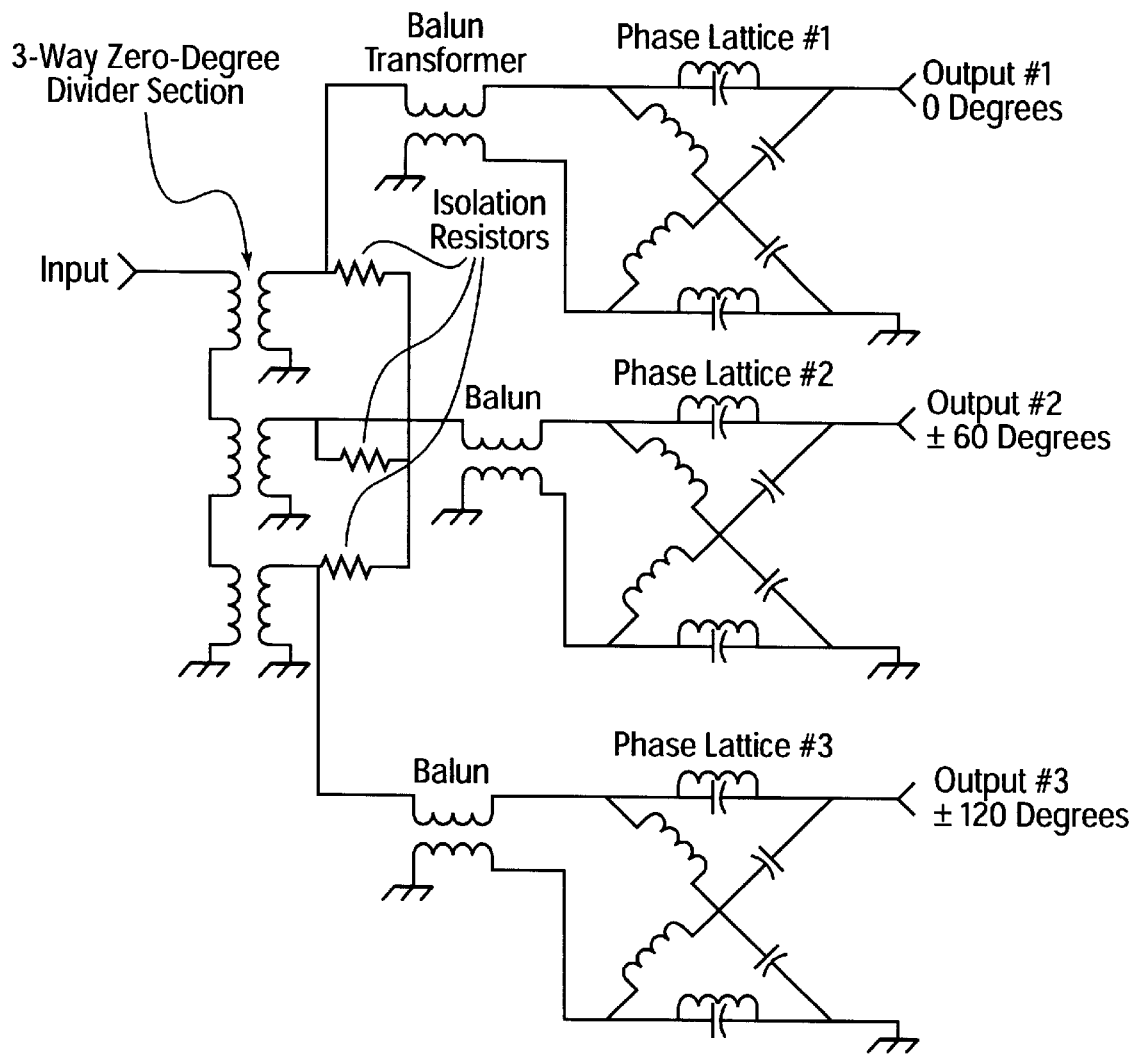
FIG. 4 shows a schematic of lumped elements (R, L, C) resistors inductors, capacitors and transformers of the three-way, three-phase divider or combiner.

FIG. 4 shows a lumped realization of a three-way, three-phase, sixty degree divider and combiner. In this embodiment the circuit consists of a three-way zero degree divider section, three isolation resistors, three balun transformers and a first, second and third all-pass phase lattice. The first phase lattice has an output at 0 degrees, the second phase output at 60 degrees and the third phase lattice has an output at 120 degrees.

Figure 5:
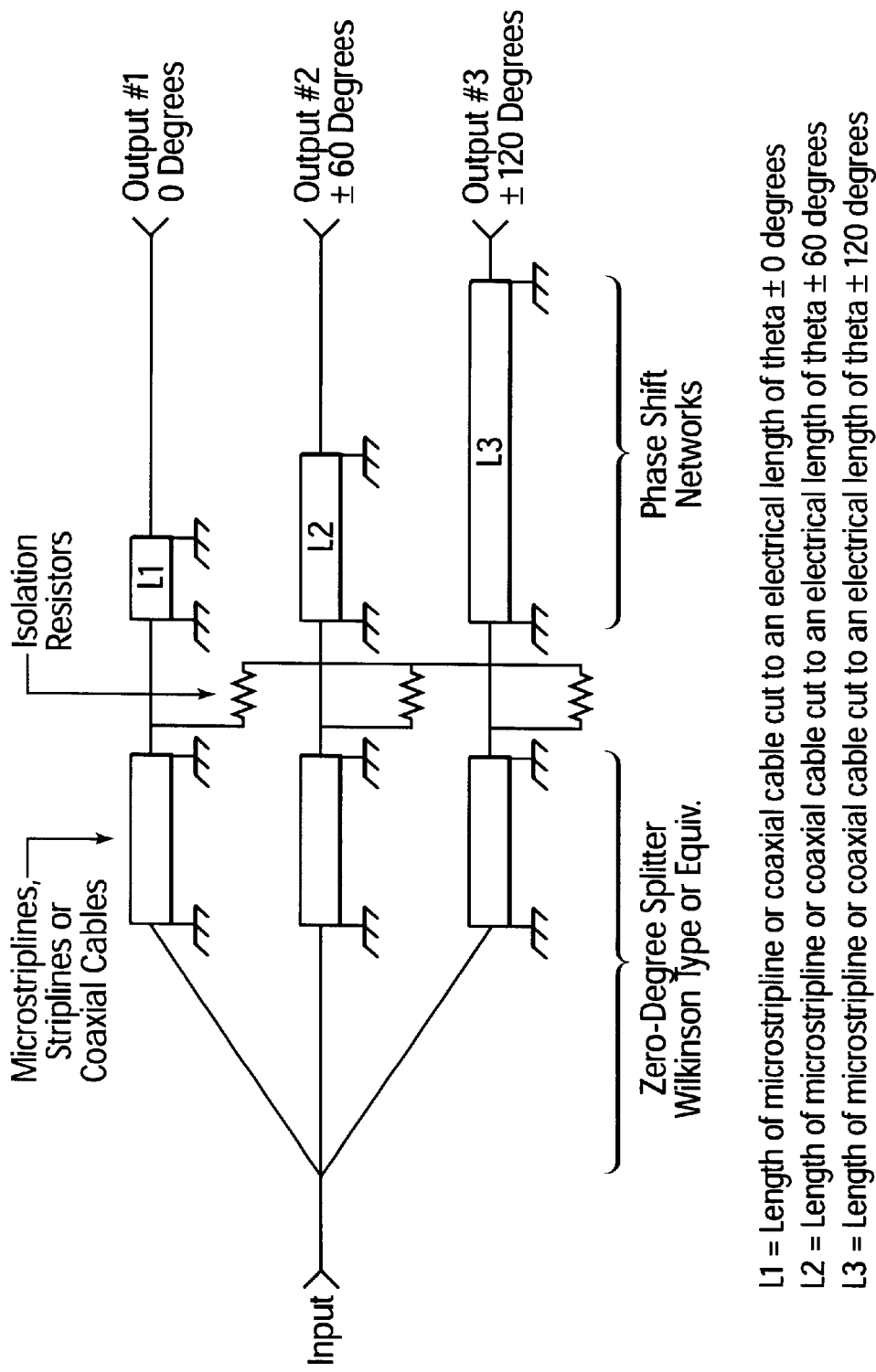
FIG. 5 shows a system of distributed elements of the three-way, three-phase divider or combiner using microstripline, stripline or coaxial cable.

FIG. 5 shows a circuit using distributed elements such as microstripline, stripline or coaxial cable. The distributed elements are cut to an electrical length of 0 degrees, 60 degrees and 120 degrees.

Figure 6:
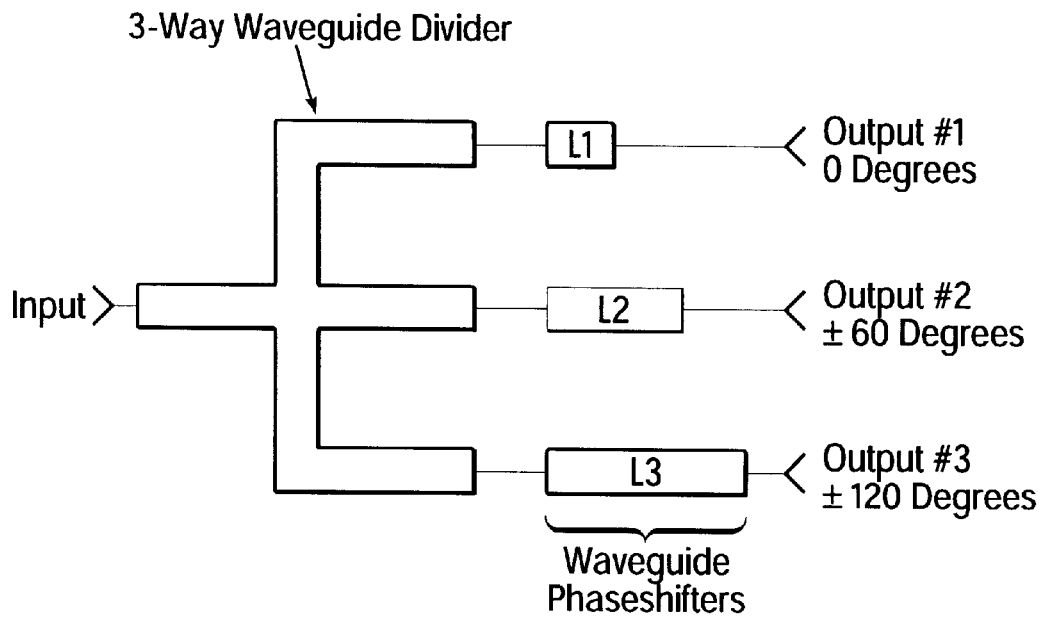
FIG. 6 shows a system of the three-way, three-phase divider or combiner using waveguides.

FIG. 6 shows a waveguide realization of a three-way, three-phase divider or combiner. In this embodiment the length of the waveguides are cut to an electrical length of 0 degrees, 60 degrees and 120 degrees.

It is typical, when using a three-way divider, to drive the inputs of 3 identical amplifiers over a broad range of frequencies. The input impedance to an amplifier varies dramatically over wide frequency ranges. When attempting to drive these amplifiers with another amplifier, the varying input impedance will cause the gain (amplification factor) of the first (driver) amplifier to fluctuate considerably. The driver amplifier may also become unstable and oscillate. A Zero degree divider will not correct for the varying input load impedance while the 3-Phase (60 degree) divider will. The result is a flat constant overall gain response over the operating frequency range as well as more stable operation.

Accordingly, while only a few embodiments of the present invention have been shown and described, it is obvious that many changes and modifications may be made thereunto without departing from the spirit and scope of the invention.

What is claimed is:

1. A three-way, three-phase power divider having three outputs for splitting an input signal into three equal signals referenced to the center port comprising:
   a) a single input for receiving the input signal; and
   b) three phase shift circuits for shifting the phase of the input signal into three signals displaced sixty decrees with reference to the center port.

2. The three-way, three-phase power divider according to claim 1 further comprises three isolation resistors.

3. The three-phase power divider according to claim 2 further comprising three balun transformers coupled to said three resistors.

4. The three-phase power divider according to claim 3, wherein said phase shift circuit comprises a first phase lattice, a second phase lattice and a third phase lattice.

5. The three-phase power divider according to claim 4, wherein a phase shift of 0 degrees occurs in said first phase lattice, a phase shift of 60 degrees occurs in said second phase lattice and a phase shift of 120 degrees occurs within said third phase lattice.

6. The three-phase power divider according to claim 2, wherein said phase shift circuit comprises distributed elements, said distributed elements being cut to an electrical length to produce phase shifts of 0 degrees, 60 degrees and 120 degrees.

7. The three-phase power divider according to claim 1, wherein said phase shift circuit comprises a first waveguide phase shifter, a second waveguide phase shifter, and a third waveguide phase shifter.

8. The three-phase power divider according to claim 7, wherein said first waveguide phase shifter has an electrical length of 0 degrees, said second waveguide phase shifter has an electrical length of 60 degrees and said third waveguide phase shifter has an electrical length of 120 degrees.

9. The three-phase power divider according to claim 1, wherein said phase shift circuit comprises a first microstripline having an electrical length of 0 degrees, 60 degrees and 120 degrees.

10. The three-phase power divider according to claim 1, wherein said phase shift circuit comprises coaxial cable having an electrical length of 0 degrees, 60 degrees and 120 degrees.

* * * * *